United States Patent [19]

Pankove et al.

[11] Patent Number: 4,684,964
[45] Date of Patent: Aug. 4, 1987

[54] SILICON LIGHT EMITTING DEVICE AND A METHOD OF MAKING THE DEVICE

[75] Inventors: Jacques I. Pankove, Boulder, Colo.; Chung P. Wu, Trenton, N.J.

[73] Assignee: RCA Corporation, Princeton, N.J.

[21] Appl. No.: 936,987

[22] Filed: Dec. 1, 1986

Related U.S. Application Data

[63] Continuation of Ser. No. 195,182, Oct. 8, 1980, abandoned.

[51] Int. Cl.$^4$ .................. H01L 45/00; H01L 33/00; H01L 29/04; H01L 29/34
[52] U.S. Cl. .................................. 357/17; 357/2; 357/52; 357/59; 357/91
[58] Field of Search ................... 357/2, 17, 30, 52, 59, 357/91

[56] References Cited

U.S. PATENT DOCUMENTS

| | | | |
|---|---|---|---|
| 4,113,514 | 9/1978 | Pankove et al. | 357/91 X |
| 4,224,084 | 9/1980 | Pankove | 357/91 X |
| 4,266,986 | 5/1981 | Benton et al. | 357/91 X |
| 4,315,782 | 2/1982 | Tarng | 357/52 X |
| 4,322,253 | 3/1982 | Pankove et al. | 357/91 X |

OTHER PUBLICATIONS

C. H. Seager et al, "Passivation of Grain Boundaries in Polycrystalline Silicon", *Applied Physics Letters*, vol. 34 (1979), pp. 337-334.
M. H. Brodsky, "Silicon Light-Emitting Devices", *IBM Technical Disclosure Bulletin*, vol. 16 (1973), p. 704.
J. I. Pankove, "Photoluminescence Recovery in Rehydrogenated Amorphous Silicon", *Applied Physics Letters*, vol. 32, No. 12 (1978), pp. 812-813.
J. T. Pankove and C. P. Wu, "Photoluminescence from Hydrogenated Ion-Implanted Crystalline Suilicon", *Applied Physics Letters*, vol. 35, No. 12 (1979), pp. 937-939.

*Primary Examiner*—J. Carroll
*Attorney, Agent, or Firm*—Joseph S. Tripoli; Harley R. Ball

[57] ABSTRACT

A light emitting device comprises a body of silicon having regions of opposite conductivity type and a region about the p-n junction between the regions of opposite conductivity type which contains lattice defects and excess hydrogen. This device emits light at a wavelength between about 1.2 and about 1.3 micrometers. The method of the invention includes the steps of damaging the region about the p-n junction and hydrogenating the damage region.

2 Claims, 2 Drawing Figures

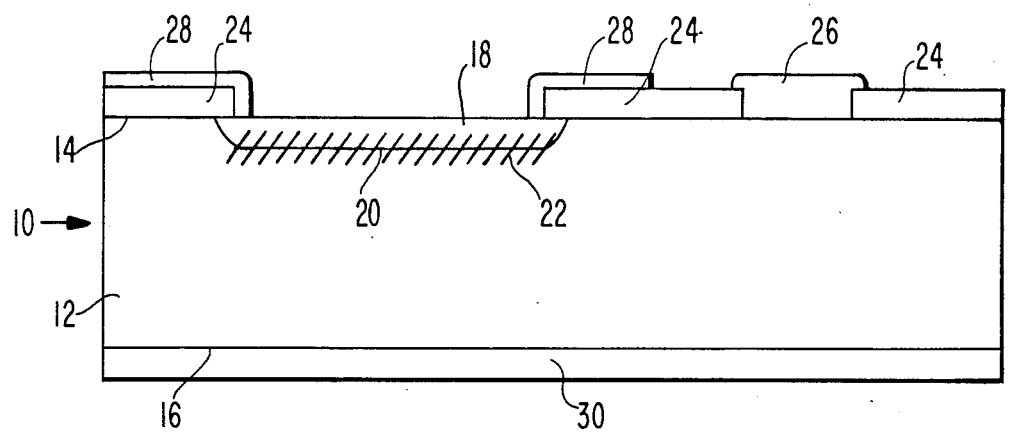
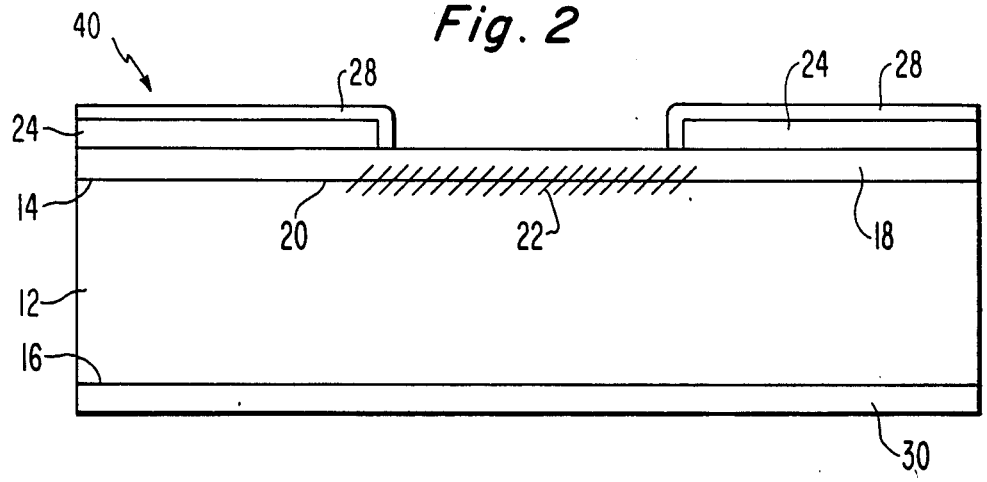

SILICON LIGHT EMITTING DEVICE AND A METHOD OF MAKING THE DEVICE

This is a continuation of application Ser. No. 195,182, filed Oct. 8, 1980, now abandoned.

The invention relates to a silicon light emitting diode device operating at about 1.25 micrometers.

BACKGROUND OF THE INVENTION

Electro-luminescent devices which emit light in the wavelength range between 1.2 micrometers and about 1.7 micrometers are used as light sources in fiber optic communication systems. Typically, light emitting diodes and injection laser diodes composed of group III-V compounds are used for this application. Such devices employ a multiplicity of layers of differing composition and require a large number of different processing steps in their fabrication. It would be desirable to have a device which emits light in this wavelength range but which is simpler to fabricate.

Silicon exhibits a luminescence at about 1.1 micrometers which is weak since the band-to-band optical transitions are indirect. Weak luminescence associated with structural defects in the silicon lattice has also been observed at a number of different wavelengths in silicon which has been irradiated with energetic particles such as ions or electrons. A much stronger luminescence in the wavelength range between about 1.0 micrometers and about 1.2 micrometers has been observed in amorphous silicon formed from the decomposition of silane in a glow discharge. In each of these cases the luminescence is either too weak to be useful as a light source or is outside the wavelength range of interest.

SUMMARY OF THE INVENTION

The invention is a light emitting device comprising a body of crystalline silicon having a p-n junction therein where a region about the p-n junction contains lattice defects and hydrogen.

The method of the invention includes the steps of damaging the region about the p-n junction and hydrogenating the damaged region.

BRIEF DESCRIPTION OF THE DRAWING

FIG. 1 is a schematic illustration of a cross sectional view of a light emitting device of the invention.

FIG. 2 is a schematic illustration of a cross sectional view of a second embodiment of the invention.

DETAILED DESCRIPTION OF THE INVENTION

Referring to the Figures, a light emitting device 10 comprises a substrate 12 having first and second major surfaces 14 and 16 respectively; a region 18 of opposite conductivity type to that of the substrate 12 extends a distance into the substrate 12 from the major surface 14 thereby forming a p-n junction at the interface 20 between the regions of opposite conductivity type; a region 22 extending about the p-n junction contains lattice defects and hydrogen; an electrically insulating layer 24 overlies a portion of the major surface 14 of the substrate 12; electrical contact is made to the substrate 12 by means of an electrically conducting layer 26 which contacts the substrate through an opening in the electrically insulating layer 24; electrical contact is made to the region 18 of opposite conductivity type to that of the substrate 12 by an electrically conducting layer 28 which contacts the region 18 through an opening in the electrically insulating layer 24; and a light reflecting layer 30 which overlies the second major surface 16 of the substrate 12.

Referring to FIG. 2, the identification of the elements common to the light emitting device 40 and the light emitting device 10 of FIG. 1 is the same. The light emitting device 40 differs in that the region of opposite conductivity type 18 is a layer which overlies the surface 14 of the substrate 12 and in that the light reflecting layer 30 also serves as the electrical contact to the substrate.

The substrate 12 is composed of a body of crystalline silicon which may be of either n- or p-type conductivity and which has a resistivity between about 0.1 ohm-cm and about 50 ohm-cm. Typically, the substrate has a resistivity of about 10 ohm-cm.

The region 18 of opposite conductivity type may be formed either by diffusion or implantation of an appropriate dopant into the surface 14 of the substrate 12 or may be formed as a layer on the surface 14 of the substrate 12 using epitaxial growth techniques. The electrically insulating layer 24, composed of a material such as silicon dioxide, having an opening therein may serve as a mask to restrict the diffusion or implantation to only a portion of the major surface 14. If the region 18 is doped using an ion implantation technique, the region is annealed after the implantation to remove damage produced by the implantation. A p-type conductivity silicon substrate with a phosphorous dopant diffused into the substrate surface to form an n-type opposite conductivity region 18 is a preferred embodiment since the phosphorous n-type dopant ion diffuses comparatively slowly in silicon. In either case the p-n junction is formed at the interface 20 between the substrate 12 and the region of opposite conductivity type 18 thereby forming a body having regions of opposite conductivity type.

We have found a comparatively strong electroluminescence centered about 1.25 micrometers and originating in the region 22 about the p-n junction in silicon when the region 22 contains lattice defects and hydrogen. The lattice defects may result from damage produced, for example, by energetic ions incident on the surface 14 of the substrate 12 and which penetrate into the region 22. This damage can be produced by an ion such as silicon, aluminum, hydrogen, deuterium, phosphorous, arsenic, fluorine or neon which is incident on the surface of the silicon substrate. The fact that the luminescence is present after damage of the lattice with silicon ions indicates that the effect arises not from doping of the lattice by the implanted ions but rather from damage produced by the implantation process itself. The energy of the incident ions may be between about 10 and about 300 kilo-electron volts (keV) and depends upon the particular ion which is to be implanted and the distance into the body to which it is desired that the ion penetrate. For example, silicon ions may be implanted at room temperature using ions having energy between about 40 keV and about 280 keV.

The region 22 also contains hydrogen in a concentration between about 3 atomic percent and about 15 atomic percent and preferably between about 10 atomic percent and about 15 atomic percent. This hydrogen concentration is introduced into the semiconductor body after the creation of the damage by holding the body at a temperature between about 200° C. and about 350° C. in a chamber containing molecular hydrogen at a pressure below about 5 torr for about ½ hour, as described by Pankove et al in U.S. Pat. No. 4,113,514 issued Sept. 12, 1978 and entitled, "METHOD OF PASSIVATING A SEMICONDUCTOR DEVICE BY TREATMENT WITH ATOMIC HYDROGEN". The role of the hydrogen in the light emitting device of the invention is to passivate dangling silicon bonds produced by the damage, thereby reducing the number of radiationless recombination centers in the material in the region.

The luminescence intensity of the light emitting device increases with implantation dose up to a maximum. For $Si^{28}$ ions implanted with an energy between 30 keV and 60 keV, the maximum occurs at a dose of $10^{18}$ ions per cubic centimeter. For doses above $10^{19}$ $Si^{28}$ ions per cubic centimeter concentration, quenching sets in, thereby reducing the luminescence efficiency with increasing dose. In fact, in concentration ranges of about $2\times10^{19}$ per cubic centimeter an emission peak corresponding to the luminescence of amorphous silicon doped wih hydrogen is seen in photoluminescence. The optimum dose varies with the ion used and its energy since these two factors determine the number of defects produced per incident ion.

The electrically conducting layer 26 is useful in a structure where the entire device is made on a single surface of the substrate. Electrical contact to the region 18 of opposite conductivity type may be made by using an electrically conducting layer 28 which contacts the surface 14 in the region 18 around its periphery permitting emission of light from the surface. The electrically conducting layers 26 and 28 and the light reflecting layer 30 may be composed of Al deposited by evaporation.

We claim:

1. A light emitting device comprising:
   a body of crystalline silicon having first and second regions of opposite conductivity type therein with a p-n junction therebetween;
   a region about the p-n junction containing lattice defects and hydrogen which region emits light at a wavelength of about 1.25 micrometers; and
   electrical contacts on the regions of opposite conductivity type at opposite sides of said p-n junction whereby a current can be passed across said junction for achieving electroluminescence at said p-n junction.

2. A light emitting device according to claim 1 wherein the concentration of hydrogen in the region containing lattice defects is between about 3 atomic percent and about 15 atomic percent.

* * * * *